United States Patent
Vasilache et al.

(10) Patent No.: US 8,762,141 B2
(45) Date of Patent: Jun. 24, 2014

(54) REDUCED-COMPLEXITY VECTOR INDEXING AND DE-INDEXING

(75) Inventors: Adriana Vasilache, Tampere (FI); Lasse Laaksonen, Nokia (FI); Anssi Rämö, Tampere (FI); Mikko Tammi, Tampere (FI)

(73) Assignee: Nokia Corporation, Espoo (FI)

( * ) Notice: Subject to any disclaimer, the term of this patent is extended or adjusted under 35 U.S.C. 154(b) by 830 days.

(21) Appl. No.: 12/867,873

(22) PCT Filed: Feb. 15, 2008

(86) PCT No.: PCT/EP2008/051901
§ 371 (c)(1), (2), (4) Date: Aug. 16, 2010

(87) PCT Pub. No.: WO2009/100768
PCT Pub. Date: Aug. 20, 2009

(65) Prior Publication Data
US 2011/0010169 A1  Jan. 13, 2011

(51) Int. Cl.
*G10L 19/00* (2013.01)
*G10L 19/12* (2013.01)
*G10L 21/04* (2013.01)

(52) U.S. Cl.
USPC ............ 704/230; 704/222; 704/500; 704/503

(58) Field of Classification Search
CPC . G10L 19/038; G10L 19/0019; G10L 19/032; G10L 19/02; G10L 19/0204; G10L 19/107; H03M 7/3082
USPC ................................. 704/222, 230, 500–504
See application file for complete search history.

(56) References Cited

U.S. PATENT DOCUMENTS

| 5,105,353 A | 4/1992 | Charles et al. |
| 6,084,595 A | 7/2000 | Bach et al. |

(Continued)

FOREIGN PATENT DOCUMENTS

| EP | 0077736 A2 | 10/1982 |
| WO | 2007/046027 A1 | 4/2007 |

OTHER PUBLICATIONS

Vasilache, "Indexing of Lattice Codevectors Applied to Error Resilient Audio Coding", AES 30th International Conference on Intelligent Audio Environments, 2007.*

(Continued)

*Primary Examiner* — Samuel G Neway
(74) *Attorney, Agent, or Firm* — Nokia Corporation (57) ABSTRACT

This invention relates to indexing an input vector contained in a set of vectors of a plurality of sets of vectors. The indexing comprises performing, in case that the input vector is contained in a set of vectors of a pre-defined group of one or more sets of vectors of the plurality of sets of vectors, a specific processing that is adapted to a characteristic of the sets of vectors in the pre-defined group of sets of vectors and is only applicable in case of input vectors contained in sets of vectors with the characteristic. The indexing further comprises performing, in case that the input vector is not contained in a set of vectors of the pre-defined group of sets of vectors, a general processing. The invention further relates to an according determining of a target vector contained in a set of vectors of a plurality of sets of vectors based on an index associated with said target vector.

16 Claims, 3 Drawing Sheets

(56) References Cited

U.S. PATENT DOCUMENTS 7,106,228 B2    9/2006  Bessette et al.
2007/0168197 A1* 7/2007  Vasilache ............... 704/503

OTHER PUBLICATIONS

"ITU-T Software Tool Library 2005 User's Manual", ITU-T Users' Group on Software Tools, ITU G.191, Edition 1.0, Aug. 2005, 225 pages.
Search Report received for corresponding Singaporian Patent Application No. 201005938.4, dated Oct. 25, 2011, 14 pages.
Office Action received for corresponding Korean Patent Application No. 2010-7020582, dated Aug. 30, 2011, 4 pages of Office Action and 3 pages of Office Action translation.
Office Action received for corresponding Chinese Patent Application No. 200880128366.X, dated Aug. 31, 2012, 7 pages of Office Action, No English Language Translation available.
Office Action received for corresponding Argentina Application No. P090100047, dated Mar. 4, 2013, 5 pages.
Office Action received for corresponding Chinese Application No. 200880128366.X, dated Mar. 25, 2013, 5 pages.
Office Action received in corresponding Chinese Application No. 200880128366.X, Dated Dec. 7, 2011, 6 pages.
Office Action received in corresponding Russian Application No. 2010-138178, Dated Nov. 1, 2011, 10 pages.
A. Vasilache and I. Tabus "Robust indexing of lattices and permutation codes over binary symmetric channels", In Signal Processing vol. 83, No. 7, pp. 1467-1486, 2003.
Ragot, et al., "Low-complexity multi-rate lattice vector quantization with application to wideband TCX speech coding at 32 kbit/s Acoustics, Speech, and Signal Processing", 2004. Proceedings. (ICASSP '04). IEEE International Conference on vol. 1, May 17-21, 2004 p. I-501-4 vol. 1.
Office Action from Vietnamese Application No. 1-2010-02216, dated Jan. 18, 2011, 2 pages.
International Search Report and Written Opinion of the International Searching Authority for PCT Application No. PCT/EP2008/051901, dated Jun. 30, 2008, 13 pages.
Wang et al., "Lattice labeling Algorithms for Vector Quantization", IEEE Transactions on Circuits and Systems for Video Technology, IEEE Service Center, vol. 8, No. 2, Apr. 1, 1998.
Office Action received for corresponding Chinese Application No. 200880128366.X, dated Oct. 17, 2013, 4 pages.

* cited by examiner

REDUCED-COMPLEXITY VECTOR INDEXING AND DE-INDEXING

RELATED APPLICATION

This application was originally filed as PCT Application No. PCT/EP2008/051901 filed 15 Feb. 2008, and is incorporated herein by reference in its entirety.

FIELD OF THE INVENTION

This invention relates to vector indexing and de-indexing.

BACKGROUND OF THE INVENTION

Low complexity algorithms for speech and audio coding are a very relevant asset for mobile terminal based communications. Due to low storage and low complexity, while preserving coding efficiency, structured codebooks are preferred, e.g. for quantization, in several state of the art speech and audio codecs like Adaptive Multi Rate-WideBand (AMR-WB) or G.EV-VBR, which is currently under standardization in ITU-T SG16/Q9.

The codebooks used within the quantization methods of the speech and audio codecs may for instance be based on lattice structures, as described in reference "Low-complexity multi-rate lattice vector quantization with application to wideband TCX speech coding at 32 kbit/s" by S. Ragot, B. Bessette and R. Lefebvre, Proceedings of the IEEE International Conference on Acoustics, Speech, and Signal Processing, 2004 (ICASSP '04), Montreal, Canada, May 17-21, 2004, vol. 1, page 501-504, which is incorporated herein in its entirety by reference. This reference also describes the quantization process in more detail.

When lattice structures are used as codebooks, algorithms for indexing the lattice points are required.

It is possible to define a lattice codebook as a union of leader classes, each of which is characterized by a leader vector. A leader vector is an n-dimensional vector, whose components are ordered (e.g. decreasingly). The leader class corresponding to the leader vector then consists of the leader vector and all vectors obtained through all the signed permutations of the leader vector (with some possible restrictions).

An algorithm for indexing points of a lattice that is defined as a union of leader classes may for instance be of the type indexing on leaders. In this context, inter alia lexicographical and binomial algorithms can be applied, as described in reference "Robust indexing of lattices and permutation codes over binary symmetric channels" by A. Vasilache and I. Tabus, In Signal Processing vol. 83, no. 7, pp. 1467-1486, 2003, which is incorporated herein in its entirety by reference.

Binomial algorithms are generally less complex because they consider several vector components at a time.

SUMMARY

There exists potential to further reduce the complexity of indexing and/or de-indexing.

According to a first aspect of the present invention, a method is disclosed, comprising indexing an input vector contained in a set of vectors of a plurality of sets of vectors. The indexing comprises performing, in case that the input vector is contained in a set of vectors of a pre-defined group of one or more sets of vectors of the plurality of sets of vectors, a specific processing that is adapted to a characteristic of the sets of vectors in the pre-defined group of sets of vectors and is only applicable in case of input vectors contained insets of vectors with the characteristic. The indexing further comprises performing, in case that the input vector is not contained in a set of vectors of the pre-defined group of sets of vectors, a general processing.

According to the first aspect of the present invention, further a computer program is disclosed. The computer program comprises instructions operable to cause a processor to index an input vector contained in a set of vectors of a plurality of sets of vectors. The indexing comprises performing, in case that the input vector is contained in a set of vectors of a pre-defined group of one or more sets of vectors of the plurality of sets of vectors, a specific processing that is adapted to a characteristic of the sets of vectors in the pre-defined group of sets of vectors and is only applicable in case of input vectors contained in sets of vectors with the characteristic. The indexing further comprises performing, in case that the input vector is not contained in a set of vectors of the pre-defined group of sets of vectors, a general processing.

According to the first aspect of the present invention, further a computer-readable medium having such a computer program stored thereon is disclosed. The computer-readable medium may be any medium that is capable of storing digital data in electric, magnetic, electro-magnetic or optic form. The medium may be fixedly installed in a device or may be a removable medium.

According to the first aspect of the present invention, further an apparatus is disclosed, comprising a processing component configured to index an input vector contained in a set of vectors of a plurality of sets of vectors. The processing component is further configured to perform, in case that the input vector to be indexed is contained in a set of vectors of a pre-defined group of one or more sets of vectors of the plurality of sets of vectors, a specific processing that is adapted to a characteristic of the sets of vectors in the pre-defined group of sets of vectors and is only applicable in case of input vectors contained in sets of vectors with the characteristic. The processing component is further configured to perform, in case that the input vector to be indexed is not contained in a set of vectors of the pre-defined group of sets of vectors, a general processing.

According to a first aspect of the present invention, further an apparatus is disclosed, comprising means for indexing an input vector contained in a set of vectors of a plurality of sets of vectors. The means for indexing comprise means for performing, in case that the input vector is contained in a set of vectors of a pre-defined group of one or more sets of vectors of the plurality of sets of vectors, a specific processing that is adapted to a characteristic of the sets of vectors in the pre-defined group of sets of vectors and is only applicable in case of input vectors contained in sets of vectors with the characteristic. The means for indexing further comprise means for performing, in case that the input vector is not contained in a set of vectors of the pre-defined group of sets of vectors, a general processing.

According to the first aspect of the present invention, the input vector is a vector that is to be indexed. The input vector is comprised in a set of vectors, which in turn is comprised in a plurality of sets of vectors. The plurality of sets of vectors may for instance serve as a codebook, for instance for a quantization process. In such a quantization process, the input vector may for instance be identified as a closest match of all vectors in the plurality of sets of vectors with respect to a vector that is to be quantized.

The indexing of the input vector assigns an index to the input vector. The index may for instance constitute a signal. The signal may be exchanged between two entities as identification of the input vector. Via the index, the input vector may at least partially be identified in the set of vectors it is contained in. The index may for instance identify the input vector within the plurality of sets of vectors, or only within the set of vectors the input vector is contained in. Furthermore, the index may be representative of the signs of the components of the input vector or not.

The indexing of the input vector may for instance at least yield a position index representative of the positions of values in the input vector. The indexing may additionally yield a sign index that is representative of a sign of the components of the input vector. The indexing may furthermore yield a final index that combines the position index and the sign index and that may additionally be representative of the leader class the input vector is contained in.

Depending on the set of vectors the input vector is contained in, a different processing is performed. If the input vector is contained in a set of vectors that belongs to the pre-defined group of sets of vectors, a specific processing is applied. Otherwise, a general processing is applied. Both kinds of processing form at least a part of the indexing of the input vector. For instance, the specific processing and the general processing may relate to the entire process of indexing, or may relate to only parts of the process of indexing.

The specific processing is adapted to a characteristic of the set of vectors the input vector is contained in.

The specific processing is tailored to the set of vectors the input vector is contained in. This allows to improve processing and to reduce the overall complexity of the indexing of the input vector.

For instance, the structure of the specific processing may be simplified as compared to the general processing, for instance by performing several actions in one loop.

Equally well, introduction of the specific processing may allow to reduce the complexity of the general processing, for instance by excluding the processing of input vectors of particular sets of vectors from general processing (and including them into the specific processing) so that general processing can be simplified. Both measures result in reduced overall complexity of the indexing of the input vector.

The tailoring may restrict applicability of the specific processing to input vectors contained in the sets of vectors with the characteristic, i.e. the specific processing may for instance not be applicable in case of input vectors contained in sets of vectors that are not in the pre-defined group of sets of vectors.

The general processing may not be restricted to application in case of input vectors contained in sets of vectors of a particular group of sets of vectors only. For instance, the general processing may be applicable in case of input vectors contained in any set of vectors of the plurality of sets of vectors, or in case of input vectors contained in any set of vectors of the plurality of sets of vectors except the sets of vectors of the pre-defined group of sets of vectors. The latter alternative may allow for optimization of the general processing with respect to input vectors contained in sets of vectors that are not in the pre-defined group of sets of vectors.

According to an exemplary embodiment of the first aspect of the present invention, the general processing, if applied to input vectors contained in the sets of vectors with the characteristic, would be more complex than the specific processing applied to the same input vectors. Therein, complexity may for instance relate to computational complexity and/or storage requirements.

According to an exemplary embodiment of the first aspect of the present invention, input vectors contained in a set of vectors in the pre-defined group of sets of vectors have a larger probability of being indexed than input vectors contained in a set of vectors that is not in the pre-defined group of sets of vectors. With respect to overall complexity, it may then be particularly useful that the specific processing is less complex than the general processing (when applied to input vectors contained in the sets of vectors with the characteristic). The probability may depend on the application the indexing is performed in. The probability may for instance be determined off-line.

According to an exemplary embodiment of the first aspect of the present invention, the sets of vectors are leader classes, and each leader class comprises a different leader vector and permutations of the leader vector. The union of these leader classes then may define a lattice, which may be used as a structured codebook for quantization, for instance in a speech, audio or video codec, in picture coding, in data compression or in any other field where quantization is applied.

The leader classes may be signed, and the indexing may at least yield a position index representative of the positions of values in the input vector and a sign index representative of the signs of the components of the input vector. Then, in the specific processing, the position index and the sign index may be jointly determined in one loop. This loop may for instance cycle through each component of the input vector. In contrast, in the general processing, the position index and the sign index may be determined only one after the other. The indexing may also yield a final index that combines the position index and the sign index and that may additionally be representative of the leader class the input vector is contained in.

Alternatively, the leader classes may be unsigned. The indexing then may only yield a position index representative of the positions of values in the input vector. As the case may be, the indexing may also yield a final index that additionally is representative of the leader class the input vector is contained in.

The characteristic to which the specific processing is adapted may be that the pre-defined group of leader classes only contains leader classes with leader vectors the components of which take only a pre-defined number of different values. This pre-defined number may for instance be two. Adapting the specific processing to this characteristic may be particularly useful in the context of binomial indexing, since, inter alia, it allows determining the position index and the sign index jointly in one loop instead of determining them one after the other. Furthermore, adapting the specific processing to this characteristic may be useful in the context of binomial indexing, since, inter alia, the indexing procedure then only has to handle the position of one value (first one) without having to make further preparations for checking the positions of the second value (its position(s) is/are fixed by the fixation of the position(s) of the first value).

The pre-defined group of leader classes may contain a first sub-group of leader classes with leader vectors the components of which take only even values, and a second sub-group of leader classes with leader vectors the components of which take only odd values. The specific processing then may prescribe different actions in case that the input vector is contained in a leader class of the first sub-group of leader classes than in a case that the input vector is contained in a leader class of the second sub-group of leader classes.

Alternatively, the characteristic to which the specific processing is adapted may be that the pre-defined group of leader classes only contains leader classes with leader vectors the components of which take a maximum number of different values. For instance, the leader classes in the pre-defined group of leader classes may have four-valued leader vectors. Handling such leader classes in the specific processing may allow to reduce the complexity of the general processing, since the general processing may then only cope with leader classes with leader vectors with three or less different values. This contributes to reducing the overall complexity of indexing of input vectors.

The general processing may be applicable in case of input vectors contained in any set of vectors of the plurality of sets of vectors except the sets of vectors of the pre-defined group of sets of vectors to allow an optimization of the general processing.

The indexing of the input vector may be performed in a quantization process that is based on a lattice codebook defined by the leader classes.

According to an exemplary embodiment of the first aspect of the present invention, the indexing is a binomial indexing. In such a binomial indexing, indexing is based on the number of possibilities of distributing values on positions in a vector of a certain dimension.

According to a second aspect of the present invention, a method is disclosed, comprising determining a target vector contained in a set of vectors of a plurality of sets of vectors based on an index associated with the target vector. The determining comprises performing, in case that the target vector is contained in a set of vectors of a pre-defined group of one or more sets of vectors of the plurality of sets of vectors, a specific processing that is adapted to a characteristic of the sets of vectors in the pre-defined group of sets of vectors and is only applicable in case of target vectors contained insets of vectors with the characteristic. The determining further comprises performing, in case that the target vector is not contained in a set of vectors of the pre-defined group of sets of vectors, a general processing.

According to the second aspect of the present invention, further a computer program is disclosed, comprising instructions operable to cause a processor to determine a target vector contained in a set of vectors of a plurality of sets of vectors based on an index associated with the target vector. The determining comprises performing, in case that the target vector is contained in a set of vectors of a pre-defined group of one or more sets of vectors of the plurality of sets of vectors, a specific processing that is adapted to a characteristic of the sets of vectors in the pre-defined group of sets of vectors and is only applicable in case of target vectors contained in sets of vectors with the characteristic. The determining further comprises performing, in case that the target vector is not contained in a set of vectors of the pre-defined group of sets of vectors, a general processing.

According to the second aspect of the present invention, further a computer-readable medium having such a computer program stored thereon is disclosed. The computer-readable medium may be any medium that is capable of storing digital data in electric, magnetic, electro-magnetic or optic form. The medium may be fixedly installed in a device or may be a removable medium.

According to the second aspect of the present invention, further an apparatus is disclosed, comprising a processing component configured to determine a target vector contained in a set of vectors of a plurality of sets of vectors based on an index associated with the target vector. The processing component is further configured to perform, in case that the target vector to be determined is contained in a set of vectors of a pre-defined group of one or more sets of vectors of the plurality of sets of vectors, a specific processing that is adapted to a characteristic of the sets of vectors in the pre-defined group of sets of vectors and is only applicable in case of target vectors contained in sets of vectors with the characteristic. The processing component is further configured to perform, in case that the target vector to be determined is not contained in a set of vectors of the pre-defined group of sets of vectors, a general processing.

According to the second aspect of the present invention, further an apparatus is disclosed, comprising means for determining a target vector contained in a set of vectors of a plurality of sets of vectors based on an index associated with the target vector. The means for determining comprise means for performing, in case that the target vector is contained in a set of vectors of a pre-defined group of one or more sets of vectors of the plurality of sets of vectors, a specific processing that is adapted to a characteristic of the sets of vectors in the pre-defined group of sets of vectors and is only applicable in case of target vectors contained in sets of vectors with the characteristic. The means for determining further comprise means for performing, in case that the target vector is not contained in a set of vectors of the pre-defined group of sets of vectors, a general processing.

According to the second aspect of the present invention, the target vector is a vector that is to be determined based on an index associated with the target vector. The target vector is comprised in a set of vectors, which in turn is comprised in a plurality of sets of vectors. The plurality of sets of vectors may for instance serve as a codebook, for instance for a quantization process. In such a quantization process, the target vector may for instance have been identified as a closest match of all vectors in the plurality of sets of vectors with respect to a vector that is to be quantized, and may have been assigned an index (i.e. may have been indexed), for instance as disclosed above with reference to the first aspect of the present invention. This index may for instance at least partially identify the target vector within a set of vectors. Additionally, this index may for instance identify the set of vectors the target vector is contained in, and may furthermore be indicative of the signs of the components of the target vector. Based on this index, according to the second aspect of the present invention, the target vector is then recovered. This may require transmission of the index from an entity that performs the indexing of the target vector to an entity that performs the determining of the target vector based on the index. To this end, the index may be considered as a signal that is transmitted between the entities. The indexing may for instance take place during a quantization, and the determining of the target vector based on the index, which may be considered as a "de-indexing", then may take place during a de-quantization.

According to the second aspect of the present invention, depending on the set of vectors the target vector is contained in, a different processing is performed. If the target vector is contained in a set of vectors that belongs to the pre-defined group of sets of vectors, a specific processing is applied. Otherwise, a general processing is applied.

The specific processing is adapted to a characteristic of the set of vectors the target vector is contained in.

The specific processing is tailored to the set of vectors the target vector is contained in under exploitation of the characteristic. This allows to improve processing and to reduce the overall complexity of the determining of the target vector. For instance, the structure of the specific processing may be simplified as compared to the general processing. This measure results in reduced overall complexity. However, the tailoring may restrict applicability of the specific processing to cases where target vectors are contained in sets of vectors with the characteristic, i.e. the specific processing may for instance not be applicable in cases where target vectors are contained in sets of vectors that are not in the pre-defined group of sets of vectors.

The general processing may not be restricted to application in cases where target vectors are contained in a particular group of sets of vectors only. For instance, the general processing may be applicable in case of target vectors contained in any set of vectors of the plurality of sets of vectors, or in case of target vectors contained in any set of vectors of the plurality of sets of vectors except the sets of vectors of the pre-defined group of sets of vectors. The latter alternative may allow for at least some optimization of the general processing.

According to an exemplary embodiment of the second aspect of the present invention, the general processing, if applied in case of target vectors contained in the sets of vectors with the characteristic, would be more complex than the specific processing applied in case of the same target vectors. Therein, complexity may for instance relate to computational complexity and/or storage requirements.

According to an exemplary embodiment of the second aspect of the present invention, target vectors contained in a set of vectors in the pre-defined group of sets of vectors have a larger probability of being determined than target vectors contained in a set of vectors that is not in the pre-defined group of sets of vectors. With respect to overall complexity, it may then be particularly useful that the specific processing is less complex than the general processing (when applied in case of target vectors contained in the sets of vectors with the characteristic). The probability may depend on the application the determining of the target vector is performed in (e.g. a de-quantization process). The probability may for instance be determined off-line.

According to an exemplary embodiment of the second aspect of the present invention, the sets of vectors are leader classes, and each leader class comprises a different leader vector and permutations of the leader vector.

The characteristic to which the specific processing is adapted may for instance be that the pre-defined group of leader classes only contains leader classes with leader vectors the components of which take only a pre-defined number of different values. The pre-defined number may for instance be two. Therein, one of the two different values may for instance be zero.

The determining of the target vector may be performed in a de-quantization process that is based on a lattice codebook defined by the leader classes.

The characteristic to which the specific processing is adapted may equally well be that the pre-defined group of leader classes only contains leader classes with leader vectors the components of which take a maximum number of different values. For instance, the leader classes in the pre-defined group of leader classes may have four-valued leader vectors. Handling such leader classes in the specific processing may allow to reduce the complexity of the general processing, since the general processing may then only cope with leader classes with leader vectors with three or less different values. This contributes to reducing the overall complexity of de-indexing of input vectors.

The general processing may be applicable in case of target vectors contained in any set of vectors of the plurality of sets of vectors except the sets of vectors of the pre-defined group of sets of vectors to allow an optimization of the general processing.

According to an exemplary embodiment of the second aspect of the present invention, the index is associated with the target vector via a binomial indexing. In such a binomial indexing, indexing is based on the number of possibilities of distributing values on positions in a vector of a certain dimension.

According to a third aspect of the present invention, a system is disclosed. The system comprises a first processing component configured to index an input vector contained in a set of vectors of a plurality of sets of vectors, the first processing component further being configured to perform, in case that the input vector to be indexed is contained in a set of vectors of a pre-defined group of one or more sets of vectors of the plurality of sets of vectors, a specific processing that is adapted to a characteristic of the sets of vectors in the pre-defined group of sets of vectors and is only applicable in case of input vectors contained in sets of vectors with the characteristic, and the first processing component further being configured to perform, in case that the input vector to be indexed is not contained in a set of vectors of the pre-defined group of sets of vectors, a general processing. The system further comprises a second processing component configured to determine a target vector contained in a set of vectors of the plurality of sets of vectors based on an index associated with the target vector, the second processing component further being configured to perform, in case that the target vector to be determined is contained in a set of vectors of a pre-defined group of one or more sets of vectors of the plurality of sets of vectors, a specific processing that is adapted to a characteristic of the sets of vectors in the pre-defined group of sets of vectors and is only applicable in case of target vectors contained insets of vectors with the characteristic, and the second processing component further being configured to perform, in case that the target vector to be determined is not contained in a set of vectors of the pre-defined group of sets of vectors, a general processing.

For the system according to the third aspect of the present invention, the above description of the features and advantages of the first and second aspects of the present invention applies accordingly.

The second processing component may for instance determine a target vector that is associated with an index that has been assigned to an input vector during indexing of the input vector by the first processing component, so that the input vector and the target vector are equal. The index may for instance be transferred between the first and second processing components.

The first and second processing components may for instance be comprised in two different devices, wherein in the device that comprises the first processing component, an input vector is indexed, and wherein in the device that comprises the second processing component, a target vector that is associated with the index determined by the first processing component is determined.

Equally well, the first and second processing components may be comprised in the same device, and may for instance be used for quantization and de-quantization, respectively.

These and other aspects of the invention will be apparent from and elucidated with reference to the detailed description presented hereinafter. The features of the present invention and of its exemplary embodiments as presented above are understood to be disclosed also in all possible combinations with each other.

BRIEF DESCRIPTION OF THE FIGURES

In the figures show.

DETAILED DESCRIPTION OF THE INVENTION

In the following detailed description of the present invention, exemplary embodiments of the present invention will be described in the context of indexing and de-indexing of lattice points in the context of the lattice quantizer proposed for the G.EV-VBR codec or its derivatives. The present invention is however not limited to this codec, to this particular lattice quantizer, or to indexing/de-indexing of lattice structures; it may equally well be applied in all other scenarios where indexing and de-indexing of vectors is required.

The G.EV-VBR codec is under standardization process in ITU-T SG16/Q9. It is a speech and audio embedded scalable codec for wideband signals having coding bitrates of 8, 12, 16, 24, and 32 kbits/s.

Figure 1:
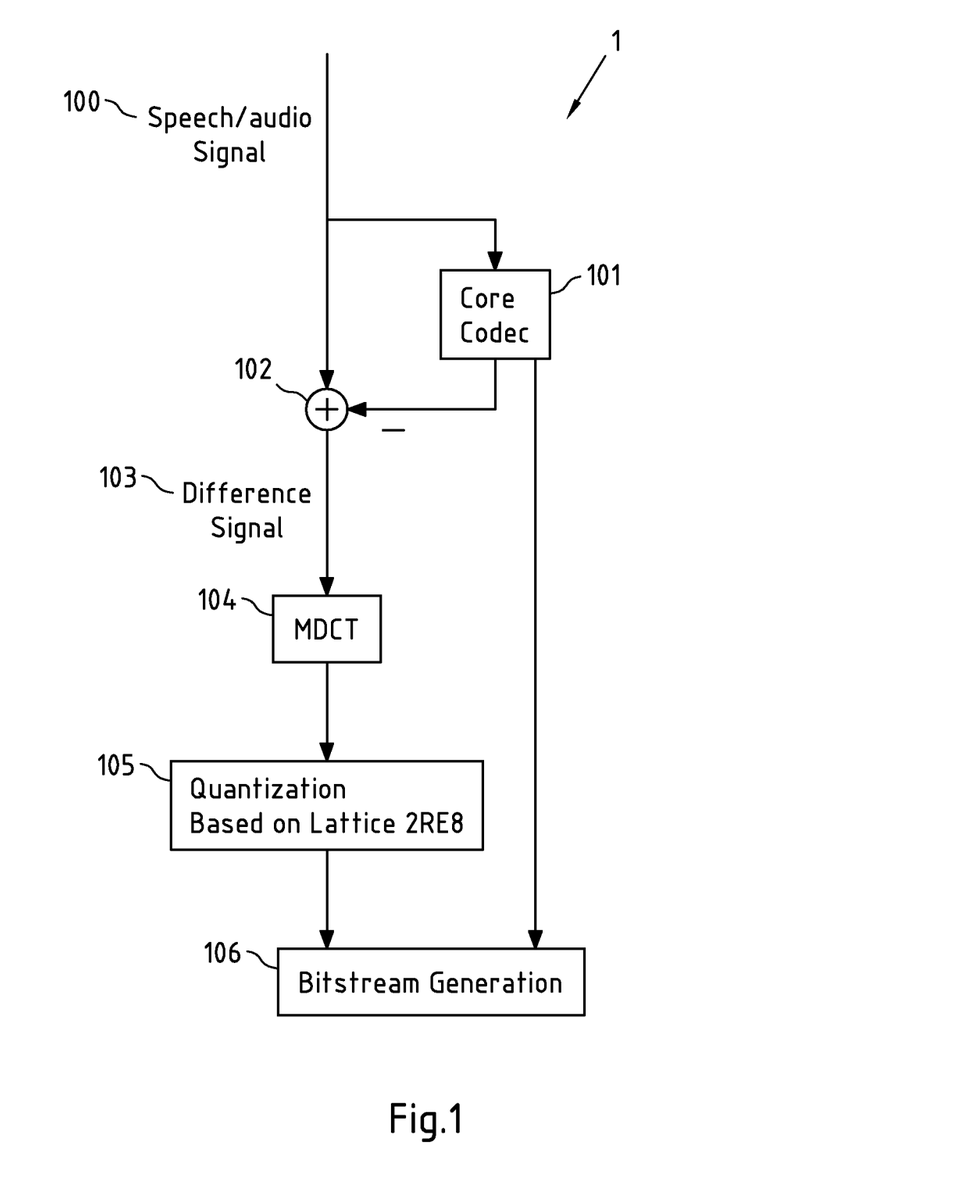
FIG. 1: A schematic block diagram of the G.EV-VBR encoder.

FIG. 1 is a schematic block diagram of the G.EV-VBR encoder 1. The first two layers are based on Code Excited Linear Prediction (CELP) and denoted as "core codec" (see core codec unit 101). The remaining layers are obtained through the encoding of the Modified Discrete Cosine Transform (MDCT) coefficients (see MDCT unit 104) of the difference signal 103 between the original signal 100 and the core codec synthesized signal, wherein the difference signal is obtained from adder 102. The quantization of the MDCT coefficients (for the layer corresponding to the bitrate 24 kbit/s) is using a quantizer 105 based on leader classes obtained from leader classes from the lattice 2RE8 which is a rotated version of the lattice E8 scaled with the factor 2. The first two layers are then combined with the remaining layers in bitstream generation unit 106.

The lattices generally used in quantization can be represented as unions of leader classes. As a consequence, quantization structures based on lattices can be described as unions of leader classes.

A leader vector is an n-dimensional integer vector, whose components are ordered (e.g. decreasingly):

$v_1, \ldots, v_1, v_2, \ldots, v_2, v_m, \ldots, v_m$), where $v_1 > v_2 > \ldots > v_m$, $v_i \in N$.

There are $n_i$ values $v_i$. The leader class corresponding to the leader vector consists of the vectors obtained through all the signed permutations of the leader class with some possible restrictions. The restrictions, when they apply, are related to the number of negative vector components which could be odd or even. The number of vectors in the leader class is $$C(v) = 2^{m-|p|} \frac{n!}{n_1! n_2! \ldots n_m!}, \quad (1)$$

where p is the parity which can be 0 (no sign constraints), +1 (even number of negative components), or −1 (odd number of negative components).

To exemplify the binomial indexing, consider the 4-dimensional leader vector (2,1,1,0). We consider here the permutations without taking into account the sign.

The vectors that belong to the leader class of (2,1,1,0) are given in Table 1 below, wherein two different indexing variants are presented:

TABLE 1

Leader Class for Leader Vector (2, 1, 1, 0)

| Index | Variant 1 | Variant 2 |
|---|---|---|
| 0 | 2, 1, 1, 0 | 2, 1, 1, 0 |
| 1 | 1, 2, 1, 0 | 2, 1, 0, 1 |
| 2 | 1, 1, 2, 0 | 2, 0, 1, 1 |
| 3 | 1, 1, 0, 2 | 1, 2, 1, 0 |
| 4 | 2, 1, 0, 1 | 1, 2, 0, 1 |
| 5 | 1, 2, 0, 1 | 0, 2, 1, 1 |
| 6 | 1, 0, 2, 1 | 1, 1, 2, 0 |
| 7 | 1, 0, 1, 2 | 1, 0, 2, 1 |
| 8 | 2, 0, 1, 1 | 0, 1, 2, 1 |
| 9 | 0, 2, 1, 1 | 1, 1, 0, 2 |
| 10 | 0, 1, 2, 1 | 1, 0, 1, 2 |
| 11 | 0, 1, 1, 2 | 0, 1, 1, 2 |

With respect to the first variant of Table 1, it can be seen that in the first group (with indices 0-3, i.e. the first four vectors, indicated by the horizontal line) the relative position of the values 1 and 0 is the same, but the position of the value 2 is changing from one vector to another. The same happens in the second group (with indices 4-7) and so on. The difference between the first and second group resides on how the components having value 1 are situated on the three positions that are available after deciding the position for the component having the value 2. The number of possible arrangements of these two values onto three positions is given by the binomial coefficient $$\binom{3}{2} = 3.$$

There are thus three groups in the first variant, wherein in each group, only the position of the value 2 is changed, so that there are $$\binom{4}{1} = 4$$

vectors in each of the three groups.

It can thus be concluded that one way to enumerate the vectors in a leader class is to consider the different values in the vector, one at a time, and check their possible positions. For the considered example (variant 1), the possible positions of the value 2 are considered first, then out of the remaining 3 positions, the positions of the components having the value 1 are considered. The positions of the component having value 0 is dependent on the position of the first two values (because is the last value), so it does not need to be considered separately.

Variant 2 in Table 1 follows a similar approach. However, the position of the value 2 is not changed within a group, but across groups. Accordingly, there are now four groups (with indices 0-2, 3-5, 6-8 and 9-11, respectively). In each of these groups, the three vectors differ in the arrangement of the value 1, which is present two times, onto the three available positions, i.e.

$$\binom{3}{2} = 3.$$

Returning to the example lattice quantizer proposed for the G.EV-VBR codec under standardization in ITU-T SG16/Q9, the leader vectors defined therein are reproduced in Table 2 below (these leader vectors may differ from the standardized leader vectors by a scaling factor). The dimension of the leader vectors (and thus the lattice) is eight, and there are a total of 36 leader vectors. Therein, the leader vectors with odd-valued components have sign constraints. In particular, if the sum of the absolute values of all eight components is a multiple of four, the number of negative components should be even, otherwise, it should be odd. For instance, the leader vector with index 0 (1,1,1,1,1,1,1,1) has sum 8, which is a multiple of four, therefore there should be an even number of −1's in the vectors from the leader class corresponding to it. The leader vector with index 3 (3,1,1,1,1,1,1,1) has sum 10, which is not a multiple of 4, therefore the number of negative components should be odd.

TABLE 2

Leader Vectors in the G.EV-VBR Codec

| Idx. | Leader Vector | Idx. | Leader Vector |
|---|---|---|---|
| 0 | {1, 1, 1, 1, 1, 1, 1, 1} | 18 | {4, 4, 4, 0, 0, 0, 0, 0} |
| 1 | {2, 2, 0, 0, 0, 0, 0, 0} | 19 | {6, 2, 2, 2, 0, 0, 0, 0} |
| 2 | {2, 2, 2, 2, 0, 0, 0, 0} | 20 | {6, 4, 2, 0, 0, 0, 0, 0} |
| 3 | {3, 1, 1, 1, 1, 1, 1, 1} | 21 | {7, 1, 1, 1, 1, 1, 1, 1} |
| 4 | {4, 0, 0, 0, 0, 0, 0, 0} | 22 | {8, 0, 0, 0, 0, 0, 0, 0} |
| 5 | {2, 2, 2, 2, 2, 2, 0, 0} | 23 | {6, 6, 0, 0, 0, 0, 0, 0} |
| 6 | {3, 3, 1, 1, 1, 1, 1, 1} | 24 | {8, 2, 2, 0, 0, 0, 0, 0} |
| 7 | {4, 2, 2, 0, 0, 0, 0, 0} | 25 | {8, 4, 0, 0, 0, 0, 0, 0} |
| 8 | {2, 2, 2, 2, 2, 2, 2, 2} | 26 | {9, 1, 1, 1, 1, 1, 1, 1} |
| 9 | {3, 3, 3, 1, 1, 1, 1, 1} | 27 | {10, 2, 0, 0, 0, 0, 0, 0} |
| 10 | {4, 2, 2, 2, 2, 0, 0, 0} | 28 | {8, 8, 0, 0, 0, 0, 0, 0} |
| 11 | {4, 4, 0, 0, 0, 0, 0, 0} | 29 | {10, 6, 0, 0, 0, 0, 0, 0} |
| 12 | {5, 1, 1, 1, 1, 1, 1, 1} | 30 | {12, 0, 0, 0, 0, 0, 0, 0} |
| 13 | {3, 3, 3, 3, 1, 1, 1, 1} | 31 | {12, 4, 0, 0, 0, 0, 0, 0} |
| 14 | {4, 2, 2, 2, 2, 2, 2, 0} | 32 | {10, 10, 0, 0, 0, 0, 0, 0} |
| 15 | {4, 4, 2, 2, 0, 0, 0, 0} | 33 | {14, 2, 0, 0, 0, 0, 0, 0} |
| 16 | {5, 3, 1, 1, 1, 1, 1, 1} | 34 | {12, 8, 0, 0, 0, 0, 0, 0} |
| 17 | {6, 2, 0, 0, 0, 0, 0, 0} | 35 | {16, 0, 0, 0, 0, 0, 0, 0} |

The binomial indexing procedure for a vector belonging to a leader class can be described by the following exemplary general indexing code, written in ANSI-C using (for the simulation of a generic Digital Signal Processor (DSP), e.g. functions sub( ) add( ) L_mult0( ), move16( )) the fixed point library provided by the ITU G.191 ITU-T Software Tool Library 2005 User's Manual. Therein, comments to the code are provided behind a double forward slash "//" or between the "/*" and "*/" signs.

This indexing code is general, i.e. it is applicable to input vectors contained in any leader class of Table 2.

```
pi = DIM;      move16( );
index = 0;     move16( );
i = 0; move16( );
tmp = sub(no_vals_[idx_lead],1);
//tmp = no_vals_[idx_lead]−1;
WHILE(tmp>0)
{
    tmp = sub(tmp,1); // tmp −−;
    IF ( tmp > 0){
        find_pos_elim_fx(abs_cv,DIM,vals_[idx_lead][i],p);
        idx = c2idx_fx(pi,p,no_vals_ind_[idx_lead][i]);
        pi = sub(pi,no_vals_ind_[idx_lead][i]);
        // pi = pi−no_vals_ind_[idx_lead][i];
        q = number_fx(sub(no_vals_[idx_lead],
```

-continued

```
        add(1,i)),&no_vals_ind_[idx_lead][i+1],pi);
        index = add(index, extract_l(L_mult0(idx, q)));
        // index = index + idx*q;
        i = add(i,1);       // i ++
    }
    ELSE{
        find_pos_fx(abs_cv,DIM,vals_[idx_lead][i],p);
        idx = c2idx_fx(pi,p,no_vals_ind_[idx_lead][i]);
        index = add(index, idx);     // index = index + idx;
    }
}
```

In this indexing code, the variables and functions/procedures have the following meaning:

DIM is the lattice dimension, i.e. 8.

The variable int no_vals_[36] stores the number of different values for each leader vector.

The variable int no_vals_ind_[36][4] stores the number of each individual value in each leader vector.

The variable int vals_[36][4] stores the values that belong to each leader vector.

The variable int idx_lead represents the index of the leader class the input vector to be indexed belongs to.

The variable int abs_cv[8] keeps the absolute values of the input vector to be indexed.

The function find_pos_elim_fx (int*abs_cv, int dim, int val, int*p) finds the positions of the components having the value val within the dim-dimensional vector of absolute values abs_cv, puts them in the array p, and eliminates them from the vector abs_cv, to prepare it for the search of the next value.

The function find_pos_fx(int*abs_cv, int dim, int val, int*p) is the same as find_pos_elim_fx without eliminating the components. This function is called for the next to last value in the leader vector because there is no further search for the last value, therefore there is no need to eliminate the component having the next to last value.

The function int c2idx_fx(int dim, int *p, int no_vals) assigns an index to the positioning of no_vals components into a total of dim possible components.

For instance:

(x x 0 0) index 0
(x 0 x 0) index 1
(x 0 0 x) index 2
(0 x x 0) index 3
(0 x 0 x) index 4
(0 0 x x) index 5, where no_vals=2, DIM=4 and the position of two "x"-es on four possible positions are indexed.

The function int number_fx(int no_vals, int*no_vals_ind_, int dim) counts the number of vectors obtained through the non-signed permutations of a dim-dimensional vector having no_vals number of values, each having the number of occurrences in the array no_vals_ind_. It corresponds to the formula from Eq. (1) without the factor $2^{m-|p|}$.

The functioning of the above-presented general indexing code can be understood from the following example. Consider once again the exemplary leader class of variant 2 of Table 1. The leader vector in this example is (2,1,1,0), and it is assumed that the leader class is associated with idx_lead=5, although it is not of importance for the example. Furthermore, assume that the input vector to be indexed is (1,0,2,1), i.e. the dimension of the example is smaller than in the exemplary lattice quantizer in Table 2, which uses 8-dimensional vectors. Due to the generality of the above indexing code, this does however not matter.

The variables in the indexing code above are then initialized to the following values:
abs_cv=(1,0,2,1)//Input vector to be indexed
　　　//in leader class 5
DIM=4//Four-dimensional vectors
no_vals[5]=3//three different values in target
　　　//vector, i.e. a three-valued target
　　　//vector
no_vals_ind__[5]=(1,2,1)//the three different values
　　　//occur one time, two times, and
　　　//one time in the input vector,
　　　//respectively
vals__[5]=(2,1,0)//the three different values in
　　　//the input vector are 2, 1 and
　　　//0, respectively
The indexing code above then produces the following results (at the end of each while-iteration):

| i | p | abs_cv | idx | pi | q | index |
|---|---|---|---|---|---|---|
| 0 | (2) | (1, 0, 1) | 2 | 3 | 3 | 6 |
| 1 | (0, 2) | (0) | 1 | 1 | 1 | 7 |

As a final result of the indexing of input vector (1,0,2,1) that is contained in leader class idx_lead=5 shown as variant 2 in Table 1 above, the (position) index 7 is thus obtained, which in fact corresponds to vector (1,0,2,1) in leader class 5.

Returning to the general indexing code presented above, in addition to the position index that is representative of the positions of values in the input vector, the information related to the sign of the non-zero values in the input vector should be encoded. The index for the sign is calculated as:

$$\text{idx\_sign} = \sum_{i=1}^{S} b_i 2^{i-1},$$

where S is the number of non-zero components in the vector to be indexed, $b_i$ is 0 if the i-th non-zero component is positive and 1 otherwise. The value of S is the same for all the vectors in a leader class.

The final index I (comprising both position and sign index information as well as information representative of the leader class the input vector is contained in) is then calculated as:

```
I = shl(index, idx_sign_max_bit[idx_lead]);
    // I = index<<idx_sign_max_bit[idx_lead];
I = L_add(I, L_deposit_l(idx_sign));
    // I = I+idx_sign;
I = extract_l(L_add(I, offset_lead_[idx_lead]));
    // I = I + offset_lead[idx_lead];
```

Therein, the variables used have the following meaning:
int_idx_sign_max bit[36] is a variable storing the number of bits on which the sign index is represented. It actually corresponds to the number of non-zero values in the vector if the parity is zero, or to the number of non-zero values-1 if the parity is +/−1.
uint offset_lead[36+1] represents the leader offset for each leader class. It actually means that if there are $n_1$ vectors in the first leader class, $n_2$ in the second and so on, the offset_lead will be: 0, $n_1$, $n_1+n_2$, . . . . In this way, information representative of the leader class the input vector is contained in can be included into the final index I.

The final index I is obtained by actually putting the idx_sign on the last idx_sign_max_bits[ ] bits of the shifted index (i.e concatenating the position index bits and idx_sign bits, while knowing that idx_sign can use idx_sign_max_bits at most, and adding the offset for the leader class to which the current vector to be indexed belongs.

The first aspect of the present invention proposes to reduce the complexity of the above-described general indexing by applying specific processing if an input vector to be indexed is contained in a leader class that belongs to a pre-defined group of leader classes, and by applying general processing otherwise.

Figure 2:
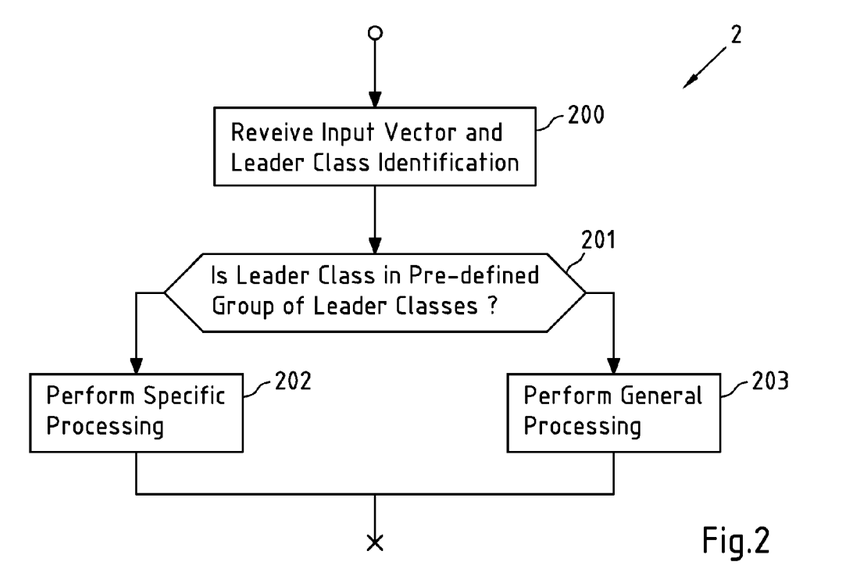
FIG. 2: a flowchart of a method for indexing an input vector according to an exemplary embodiment of the first aspect of the present invention.

FIG. 2 is a flowchart 2 illustrating a method for indexing of an input vector according to an exemplary embodiment of the first aspect of the present invention.

In a first step 200, an input vector is received. The input vector may for instance be determined during a quantization process, for instance as closest match to all vectors in a lattice that is a union of leader classes. An identification of the leader class in which the input vector is contained is also received in step 200. This may for instance be an index for the leader class, or the leader vector of the leader class the input vector is contained in, to name but a few examples.

In a step 201, it is then determined if the leader class is contained in a pre-defined group of one or more leader classes. If this is the case, a specific processing is applied in step 202. Otherwise, a general processing is applied in a step 203.

Examples for the pre-defined group of leader classes and for the specific processing applied when indexing input vectors that are contained in leader classes of such a pre-defined group of leader classes will now be discussed in more detail.

According to a first exemplary embodiment of the first aspect of the present invention, only the leader class that is associated with the leader vector with index 20 (see Table 2), i.e. {6,4,2,0,0,0,0,0}, is subjected to a specific processing. Thus the pre-defined group of leader classes only contains one leader class, identified by index 20.

In particular, the call of the function number_fx( ) in the general indexing code described above may be replaced by the following code:

```
IF (sub(idx_lead,20)==0)      // if (idx_lead == 20)
{
    q = 42;    move16( );
    if (sub(tmp,1) ==0 ){  // if (tmp == 1)
        q = 6;    move16( );
    }
}
ELSE {
    q = C[sub(pi,1)][(no_vals_ind_[idx_lead][add(i,1)])];
    move16( );
    // q = C[pi−1][no_vals_ind_[idx_lead][i+1]];
}
```

Therein, the variable C[DIM+1][DIM+1] stores the binomial coefficients up to dimension 8.

In this embodiment, the specific processing is represented by the code that is executed in case that idx_lead equals 20, and the general processing is represented by the code that is executed if idx_lead does not equal 20.

In the context of this embodiment, the inventors have observed that the leader class with index 20 is the single leader having 4 different values. The leader vector with index 20, being the only one with four different values, forces the table no_vals_ind_ to be of dimension 36×4 (36 leader classes and a maximum number of four different values per leader class), i.e. no_vals_ind_[idx_lead] [i] is only different from zero for idx_lead=20 and i=3 (i ranges from 0 to 3). However, in the general indexing code presented above, the only reference to this non-zero value of no_vals_ind_occurs for idx_lead=20 in function number_fx( ) It is thus instructive to split the function number_fx( ) into a specific processing (for the leader class with leader vector index 20) and a general processing (for the remaining leader classes), wherein in the general processing, now only reference to a table no_vals_ind_ with dimensions 36×3 is required. The introduction of the specific processing thus allows to optimize the general processing.

In the context of a second exemplary embodiment of the first aspect of the present invention, the inventors have observed that in some practical use cases a small subset of the leader classes are occurring more frequently than the other ones. For example for the data that is quantized with the lattice quantizer within the G.EV-VBR codec with the lattice structure that is built on the leader vectors of Table 2, the leader vector with index 1, i.e. (2,2,0,0,0,0,0,0), is most likely to be used and, generally, the vectors for which the leader vector has two different values (e.g. the leader vectors with indices 1, 2, 3, 4, 5, 6, 9, etc.) are more likely to be used than the other vectors. They concluded that it would be reasonable to think of a method of indexing for which the complexity is smaller particularly for these vectors.

For the calculation of the index for the sign, there is need for a loop to check the sign of each vector component. It is less complex to consider separately/specifically the leader vectors having only two different values, because the indexing procedure handles the position of only one value (first one) without having to make further preparations for checking the positions of following values. In addition, most of the leader vectors with two values only, have one zero value (see for instance the leader vectors with index 1, 2, 4 etc. in Table 2), so the creation of the position index can be efficiently coupled with the creation of the sign index in the same loop.

There are two types of leaders with two values, one type having even values only (see for instance the leader vectors with indices 1, 2, 4, 5 etc. in Table 2) and the other having odd values only (see indices 3, 6, 9 etc.). For the first type, most of the components have the value 0, while for the second type, most of the components have the value 1.

For example, the following specific procedure can be used to replace the entire general indexing code described above to process the two-valued vectors with even components.

```
idx_sign = 0;      move16( );
index = 0;      /* used as cnt */ move16( );
FOR(i=0;i<DIM;i++)
{
    q = cv[i];              move16( ); logic16( );
    if (q)
    {
        p[index] = i; move16( ); // for position index
    }
    if(q<0)
    {
        tmp = shl(1,index);      // for sign index
    }
    if (q<0){
        idx_sign = add(idx_sign,  tmp); // for sign index
    }
```

```
    if (q){
        index = add(index,1);
    }
}
index = c2idx_fx(DIM,p,index);   // position index
```

In a similar manner, the second type (two-valued vectors with odd values) can be treated separately using for example the following procedure:

```
idx_sign = 0; move16( );
index = 0; move16( );
FOR(i=0;i<DIM;i++)
{
    q = cv[i];          move16( );
    if (q <0)
    {
        tmp = shl(1,i);
    }
    if (q<0)
    {
        idx_sign = add(idx_sign,tmp);
    }
    if (q<0){
        q = sub(0,q);
    }
    tmp = sub(q,1);
    if (tmp)
    {
        p[index] = i; move16( );
    }
    if(tmp){
        index = add(index,1);
    }
}
idx_sign = shl(idx_sign,1); // due to non-zero parity
index = c2idx_fx(DIM,p,index);
```

In this second exemplary embodiment of the first aspect of the present invention, the pre-defined group of leader classes thus comprises all leader classes with only two-valued leader vectors (i.e. leader classes with leader vector indices 1, 2, 3, 4, 5, 6, 9, etc.). The specific processing is represented by the two code segments specifying the processing for the two-valued leader vectors with even and odd components, respectively, and the general processing is represented by the general indexing code that is applied for all other leader classes (e.g. leader classes with leader vector indices 0, 7, 8, 10, etc. in Table 2). Therein, it is to be noted that the pre-defined group is split into two sub-groups here, a first sub-group with two-valued leader vectors with even components, and a second sub-group with two-valued leader vectors with odd components, and that for each of these sub-groups, different actions are performed in the specific processing.

As a first modification of the second exemplary embodiment of the first aspect of the present invention, it would also be possible to dispense with the specific processing for the two-valued leader vectors with odd components (e.g. indices 3, 6, 9 etc.), and to perform the general indexing code instead. The pre-defined group of leader classes then would only contain the leader classes with two-valued leader vectors with even components. Alternatively, the specific processing for the two-valued leader vectors with even components could be dispensed with.

As a second modification of the second exemplary embodiment of the first aspect of the present invention, it would also be possible to restrict the specific processing to the determining of the position index ("index") only, or to the determining of the sign index ("idx_sign") only. This modification could of course also be applied to the first modification of the second exemplary embodiment of the first aspect of the present invention.

The first aspect of the present invention is directed to indexing of an input vector, which is for instance required during quantization. The second aspect of the present invention, which will be described in the following, is directed to de-indexing, i.e. to determining (or recovering) a target vector based on an index associated with the target vector.

A binomial de-indexing procedure for a target vector belonging to a leader class as defined by Table 2 can be described by the following exemplary general de-indexing code. This de-indexing code is general, i.e. it is applicable to target vectors contained in any leader class of Table 2. The variables and functions used in this de-indexing code correspond to the ones used in the general indexing code presented in the context of the first aspect of the present invention above. The de-indexing procedure receives the variable idx_lead, which identifies the leader class, and the variable index_loc, which identifies the position index (which is representative of the positions of values in the target vector), as an input, and determines the target vector cv as an output. Therein, the sign of the target vector is not considered, it may be recovered in a separate procedure.

```
FOR(j=0;j<DIM;j++){
    cv[j] = vals__[idx__lead][sub(no__vals__[idx__lead],1)];
    move16( ); /* put by default the last value */
    occ__pos[j] = 0;      move16( );
}
/*--------------------------------------------------*/
no__places__old = DIM;      move16( );
FOR(i=0;i<sub(no__vals__[idx__lead],1);i++)
{
    no__vals__crt = no__vals__[idx__lead];
    no__places=sub(no__places__old,no__vals__ind__[idx__lead][i]
    );
    tmp = sub(no__vals__[idx__lead], add(2,i));
    IF (tmp>0){
        quotient = number__fx(sub(no__vals__crt, add(1,i)),
        &no__vals__ind__[idx__lead][i], no__places);
        idx = div__int(index__loc , quotient, &index__loc);
        /* integer division: index__loc/quotient = idx,
        reminder index__loc */
        /* p is a table with the positions of the value vals[i]
        out of no__places available positions */
        idx2c__fx(no__places__old, p,
        no__vals__ind__[idx__lead][i],idx);
        no__places__old = no__places;      move16( );
        /* put the i-th value in the codevector */
        IF (i==0)
        {
            FOR(j=0;j<no__vals__ind__[idx__lead][i];j++)
            {
                pos = p[j];      move16( );
                cv[pos] = vals__[idx__lead][i];      move16( );
                occ__pos[pos] = 1;      move16( );
            }
        }ELSE{
            FOR(j=0;j<no__vals__ind__[idx__lead][i];j++)
            {
                pos = offset[p[j]];      move16( ); move16( );
                cv[pos] = vals__[idx__lead][i];      move16( );
                occ__pos[pos] = 1;      move16( );
            }
        }
        /* update offset */
        l=0;      move16( );
        FOR( j=0; j<DIM; j++ )
        {
```

-continued

```
            IF (occ__pos[j]==0)
            {
                offset[l]=j;      move16( );
                l = add(l,1);
            }
        }
    }
    ELSE{
        idx2c__fx(no__places__old, p,
        no__vals__ind__[idx__lead][i],index__loc);
        /* put the next to last-th value in the codevector
        */
        FOR(j=0;j<no__vals__ind__[idx__lead][i];j++)
        {
            pos = offset[p[j]];      move16( ); move16( );
            cv[pos] = vals__[idx__lead][i];      move16( );
        }
    }
}
```

Therein, the function idx2c_fx(int dim, int*p, int no_vals, int index_loc) is complementary to function c2idx_fx discussed above and returns the positioning p of no_vals components in a dim-dimensional vector as prescribed by index_loc.

Furthermore, variable int occ_pos[8] keeps track of the positions on which the components of the already decoded values have been put. The variable int offset[8] is used to find out the real position of the values, because if, for instance one value has been already placed on a 8-dimensional vector, the position index for the following value is relative to seven positions only. E.g. for 4-dimensional leader (2 1 1 0), if when decoding the position of the value 2 gives (x 2 x x) and the position index for the value 1 is 0, this corresponds to positions (0,1) for the two values one, but the ones will be actually put on the positions (0,2) because the first value, 2, is already on position 1.

Figure 3:
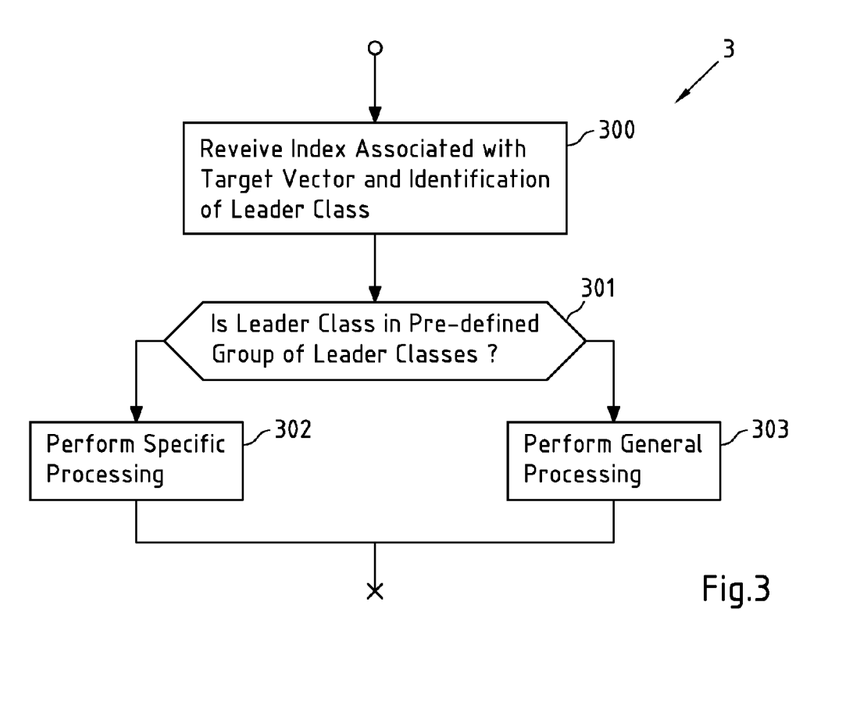
FIG. 3: a flowchart of a method for determining a target vector based on an index associated with the target vector according to an exemplary embodiment of the second aspect of the present invention.

FIG. 3 is a flowchart 3 illustrating a method for determining a target vector based on an index associated with the target vector according to an exemplary embodiment of the second aspect of the present invention. This method may for instance be performed during a de-quantization process.

In a first step 300, an index associated with a target vector that is to be determined is received. The index may for instance be an index that selects a vector from the vectors of a leader class, wherein the vectors in the leader class may for instance be binomially indexed. In addition to the index, an identification of the leader class in which the target vector is contained is received. This is however optional, since the identification of the leader class in which the target vector is contained may equally well be contained in the index associated with the target vector. The index and the identification of the leader class received in step 300 may for instance be obtained from an index that contains all of the following information: an identification of the leader class, information on which vector in the leader class shall be determined as target vector, and sign information for the target vector.

The target vector that is to be determined in the flowchart 3 of FIG. 3 may for instance have been selected as a closest match to all vectors in a lattice during a quantization process.

In a step 301, it is then determined if the leader class is contained in a pre-defined group of one or more leader classes. If this is the case, a specific processing is applied in step 302. Otherwise, a general processing is applied in a step 303.

Examples for the pre-defined group of leader classes and for the specific processing applied when de-indexing target vectors that are contained in leader classes of such a pre-defined group of leader classes will now be discussed in more detail.

According to a first exemplary embodiment of the second aspect of the present invention, only the leader class that is associated with the leader vector with index 20 (see Table 2), i.e. {6,4,2,0,0,0,0,0}, is subjected to a specific processing. Thus the pre-defined group of leader classes only contains one leader class, identified by index 20.

In particular, the first FOR-loop (above the horizontal dashed line) of the above-presented general de-indexing code then may be replaced by the following code:

```
FOR(j=0;j<DIM;j++){
    if (sub(idx_lead,20)==0){
        cv[j] = 0;         move16( );
    }
    if (sub(idx_lead,20))
    {
        cv[j] = vals_[idx_lead][sub(no_vals_[idx_lead],1)];
        move16( );
    }
    occ_pos[j] = 0;        move16( );
}
```

Furthermore, the call of the function number_fx ( ) in the general de-indexing code may then be replaced by the following code:

```
IF (sub(idx_lead, 20)==0)
{
    quotient = 42; move16( );
    if (sub(tmp,1) ==0 ){
        quotient = 6;     move16( );
    }
}
ELSE{
    quotient =
    C[sub(no_places,1)][(no_vals_ind_[idx_lead][add
        (i,1)])];    move16( );
}
```

Therein, as already explained above, the variable C[DIM+1][DIM+1] stores the binomial coefficients up to dimension 8.

In this embodiment, the specific processing is represented by the code that is executed in case that idx_lead equals 20, and the general processing is represented by the code that is executed if idx_lead does not equal 20.

In the context of this embodiment, the inventors have observed that the leader class with index 20 is the single leader having 4 different values. The leader vector with index 20, being the only one with four different values, forces both the table no_vals_ind_ and the table vals_ to be of dimension 36×4 (36 leader classes and a maximum number of four different values per leader class), i.e. no_vals_ind_[idx_lead] [i] and vals_[idx_lead] [i] exist only for idx_lead=20 and i=3 (i ranges from 0 to 3). However, in the general de-indexing code presented above, the only reference to the respective values of no_vals_indx_ and vals_ occurs for idx_lead=20 in the portions of the general de-indexing code that have been replaced by the specific code. Then, in the remainder of the general de-indexing code, now only reference to tables no_vals_ind_ and vals_ with dimensions 36×3 is required. The introduction of the specific processing thus allows to optimize the general processing.

According to a second exemplary embodiment of the second aspect of the present invention, the pre-defined group of leader classes only contains the leader class with the leader class vector with index 1 (see Table 2), i.e. (2,2,0,0,0,0,0,0). Instead of always performing a general de-indexing, i.e. a de-indexing that is applicable in case of target vectors contained in any leader class (and that has been presented with reference to the general de-indexing code above), for example the following specific processing may be performed in case of a target vector that is contained in the leader class with the leader class vector with index 1, and the general processing is only performed otherwise. Note that, as in the general de-indexing code presented above, the following specific processing only yields the unsigned target vector cv.

```
FOR(i=0;i<DIM;i++)
{
    cv[i] = 0;         move16( );
}
idx2c_fx(DIM, p, 2,index_loc);
FOR(i=0;i<2;i++)
{
    cv[p[i]]=2;  move16( );    move16( );
}
```

In the G.EV.VBR codec (i.e. for the codebook based on the leader vectors defined in Table 2) and speech and music data at bitrates of 16, 24 and 32 kbits/s) the leader vector (2,2,0,0,0,0,0,0) is by far the most probable, so that applying a specific processing to its leader class reduces the overall complexity of the de-indexing procedure.

Figure 4:
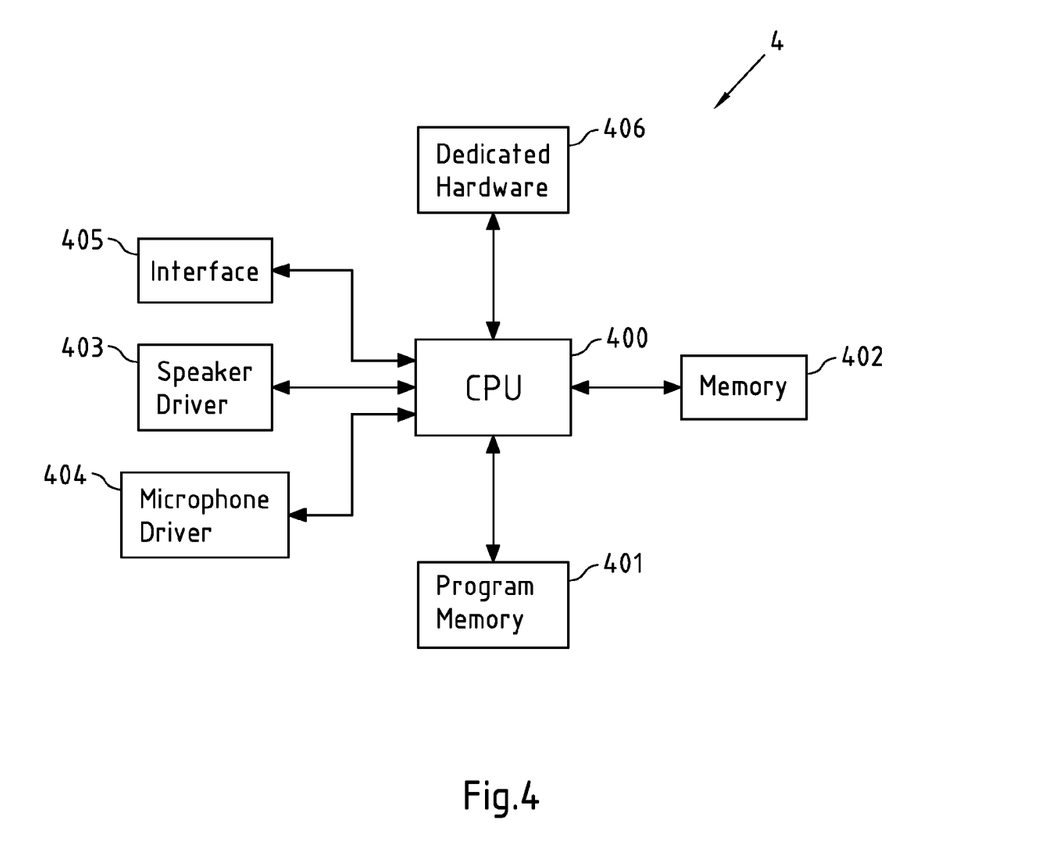
FIG. 4: a schematic block diagram of a device capable of implementing the methods according to the first and second aspect of the present invention.

FIG. 4 is a schematic block diagram of a device 4 that is capable of implementing the methods according to the first and second aspect of the present invention. This device may for instance be a mobile phone, a computer, or any other electronic device. The device comprises a Central Processing Unit (CPU) 400, which has access to a program memory 401 and a memory 402. The CPU 400 may for instance execute a computer program that is stored in program memory 401. Therein, program memory 401 may be fixedly installed in device 4, or be removable. For instance, the program memory 401 may be embodied as a computer-readable medium that has the computer program stored thereon. Memory 402 may for instance be embodied as Random Access Memory (RAM). Program memory 401 and memory 402 may equally well be embodied as a single component.

CPU 400 further controls a microphone driver, which in turn controls a microphone, a speaker driver 403, which in turn controls a speaker, and an interface 405, via which data can be exchanged with other devices. The interface 405 may for instance be embodied as a radio interface.

Device 4 thus comprises all components required to establish a audio-based communication with another entity. Audio signals received via microphone driver 404 can be encoded by the CPU 400 and sent via interface 405 to another device. Equally well, audio data from other devices can be received via interface 405, decoded by CPU 400, and rendered via speaker driver 403.

Therein, to perform encoding and decoding, CPU 400 of device 4 runs a codec, for instance the G.EV-VBR codec. This codec may for instance be embodied as computer program that is stored in program memory 401. In this way, device 4 may for instance implement the structural blocks 101, 104, 105 and 106 of FIG. 1.

CPU 400 may be understood as a processing component that performs indexing of input vectors (according to the flowchart of FIG. 2) and/or determining of a target vector based on an index associated with the target vector (according to the flowchart of FIG. 3) and, to this end, performs specific and general processing according to the first and second aspect of the present invention. Equally well, the codec, or parts thereof, may be implemented in dedicated hardware 406 (e.g. a Digital Signal Processor (DSP), a Field Programmable Gate Array (FPGA), an Application Specific Integrated Circuit (ASIC), or any other dedicated hardware), and then the dedicated hardware 406 may be understood as a processing component that performs indexing of input vectors and/or determining of a target vector based on an index associated with the target vector and, to this end, performs specific and general processing according to the first and second aspect of the present invention.

The program code executed by CPU 400 can also be viewed as comprising such processing components in the form of functional modules.

The invention has been described above by means of exemplary embodiments. It should be noted that there are alternative ways and variations which are obvious to a skilled person in the art and can be implemented without deviating from the scope and spirit of the appended claims.

The invention claimed is:

1. A method, comprising:
   indexing, using a processor, an input vector in a set of vectors of a plurality of sets of vectors, wherein said indexing comprises:
   performing, using a processor, in case that said input vector is in a set of vectors of a pre-defined group of one or more sets of vectors of said plurality of sets of vectors, a specific processing that is adapted to a characteristic of said sets of vectors in said pre-defined group of sets of vectors and is applicable in case of input vectors contained in sets of vectors with said characteristic, wherein said sets of vectors are leader classes, wherein each leader class comprises a different leader vector and permutations of said leader vector; and wherein said leader classes are signed, and wherein said indexing yields a position index representative of the positions of values in said input vector and a sign index representative of the signs of the components of said input vector, and wherein in said specific processing, said position index and said sign index are jointly determined in one loop; and
   performing, using a processor, in case that said input vector is not in said set of vectors of said pre-defined group of sets of vectors, a general processing.

2. The method according to claim 1, wherein said pre-defined group of leader classes contains a first sub-group of leader classes with leader vectors the components of which take even values, and a second sub-group of leader classes with leader vectors the components of which take odd values, and where said specific processing prescribes different actions in case that said input vector is in a leader class of said first sub-group of leader classes than in a case that said input vector is in a leader class of said second sub-group of leader classes.

3. The method according to claim 1, wherein said general processing, if applied to input vectors in said sets of vectors with said characteristic, would be more complex than said specific processing applied to the same input vectors.

4. The method according to claim 1, wherein said characteristic to which said specific processing is adapted is that said pre-defined group of leader classes contains leader classes with leader vectors the components of which take a maximum number of different values.

5. The method according to claim 1, wherein said general processing is applicable in case of input vectors in any set of vectors of said plurality of sets of vectors except said sets of vectors of said pre-defined group of sets of vectors to allow an optimization of said general processing.

6. The method according to claim 1, wherein said indexing is a binomial indexing.

7. The method according to claim 1, wherein said indexing of said input vector is performed in a quantization process that is based on a lattice codebook defined by said leader classes.

8. An apparatus, comprising: a processing component configured to index an input vector in a set of vectors of a plurality of sets of vectors, said processing component further being configured to perform, in case that said input vector to be indexed is in a set of vectors of a pre-defined group of one or more sets of vectors of said plurality of sets of vectors, a specific processing that is adapted to a characteristic of said sets of vectors in said pre-defined group of sets of vectors and is applicable in case of input vectors contained in sets of vectors with said characteristic, wherein said sets of vectors are leader classes, wherein each leader class comprises a different leader vector and permutations of said leader vector, wherein said leader classes are signed, and wherein said indexing yields a position index representative of the positions of values in said input vector and a sign index representative of the signs of the components of said input vector, and wherein in said specific processing, said position index and said sign index are jointly determined in one loop; and said processing component further being configured to perform, in case that said input vector to be indexed is not in said set of vectors of said pre-defined group of sets of vectors, a general processing.

9. The apparatus according to claim 8, wherein said pre-defined group of leader classes contains a first sub-group of leader classes with leader vectors the components of which take even values, and a second sub-group of leader classes with leader vectors the components of which take odd values, and where said specific processing prescribes different actions in case that said input vector is in a leader class of said first sub-group of leader classes than in a case that said input vector is in a leader class of said second sub-group of leader classes.

10. The apparatus according to claim 8, wherein said general processing, if applied to input vectors in said sets of vectors with said characteristic, would be more complex than said specific processing applied to the same input vectors.

11. The apparatus according to claim 8, wherein said characteristic to which said specific processing is adapted is that said pre-defined group of leader classes contains leader classes with leader vectors the components of which take a maximum number of different values.

12. The apparatus according to claim 8, wherein said general processing is applicable in case of input vectors in any set of vectors of said plurality of sets of vectors except said sets of vectors of said pre-defined group of sets of vectors to allow an optimization of said general processing.

13. The apparatus according to claim 8, wherein said indexing is a binomial indexing.

14. The apparatus according to claim 8, wherein said indexing of said input vector is performed in a quantization process that is based on a lattice codebook defined by said leader classes.

15. The method according to claim 1, wherein said characteristic to which said specific processing is adapted is that said pre-defined group of leader classes contains leader classes with leader vectors the components of which take a pre-defined number of different values.

16. The apparatus according to claim 8, wherein said characteristic to which said specific processing is adapted is that said pre-defined group of leader classes contains leader classes with leader vectors the components of which take a pre-defined number of different values.

\* \* \* \* \*